United States Patent [19]
Yasuda

[11] Patent Number: 5,386,437
[45] Date of Patent: Jan. 31, 1995

[54] PHASE-LOCKED LOOP CIRCUIT

[75] Inventor: Nobuyuki Yasuda, Chiba, Japan

[73] Assignee: Sony Corporation, Tokyo, Japan

[21] Appl. No.: 973,109

[22] Filed: Nov. 6, 1992

[30] Foreign Application Priority Data

Nov. 8, 1991 [JP] Japan .................. 3-321331

[51] Int. Cl.⁶ .................................. H03D 3/24
[52] U.S. Cl. .......................... 375/120; 375/118; 331/25; 327/7; 327/159
[58] Field of Search ............. 375/119, 118, 120; 331/2, 7, 18, 25; 307/510, 511, 525, 528

[56] References Cited

U.S. PATENT DOCUMENTS

| | | | |
|---|---|---|---|
| 4,365,211 | 12/1982 | Lee | 375/120 |
| 4,510,461 | 4/1985 | Dickes et al. | 331/2 |
| 4,600,896 | 7/1986 | Cellerino | 331/11 |
| 4,780,759 | 11/1988 | Matsushima et al. | 375/120 |
| 4,819,081 | 4/1989 | Valk et al. | 375/119 |
| 4,827,490 | 5/1989 | Guérin | 375/119 |
| 5,121,010 | 6/1992 | Hoshizaki et al. | 331/25 |
| 5,142,247 | 8/1992 | Lada, Jr. et al. | 331/2 |
| 5,194,828 | 3/1993 | Kato et al. | 375/120 |
| 5,260,979 | 11/1993 | Parker et al. | 375/120 |
| 5,276,716 | 1/1994 | Wincn | 375/120 |
| 5,278,702 | 1/1994 | Wilson et al. | 375/120 |
| 5,278,874 | 1/1994 | Liu et al. | 375/120 |

*Primary Examiner*—Stephen Chin
*Assistant Examiner*—Amanda T. Le
*Attorney, Agent, or Firm*—Jerry A. Miller

[57] ABSTRACT

A phase-locked loop circuit includes a phase comparator for comparing a phase of an input signal with a reference input, connecting circuits having circuit elements arranged in signal paths to be selectively operative, output circuit for supplying an output of the phase comparing means to the connecting circuits, and control circuit located between the output circuit and phase comparator for making a signal path operative by controlling the output circuit.

20 Claims, 11 Drawing Sheets

FIG. 2(a) COMP 
FIG. 2(b) PREF 
FIG. 2(c) FF41 
FIG. 2(d) FF42 
FIG. 2(e) NAND 43 
FIG. 2(f) NAND 71 (ENABL:H) 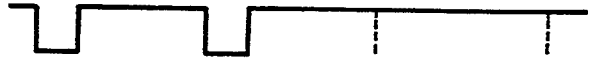
FIG. 2(g) AND 72 (ENABL:H) 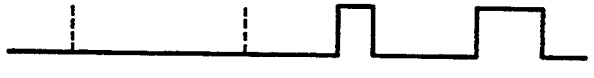
FIG. 2(h) NAND 71 (ENABL:L) 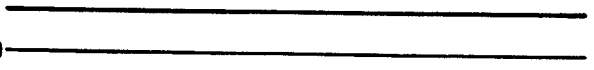
FIG. 2(i) AND 72 (ENABL:L) 
FIG. 2(j) PHCO 1 (ENABL:H) 
FIG. 2(k) PHCO 2 (ENABL:H) 
FIG. 2(l) PHCO 1 (ENABL:L) 
FIG. 2(m) PHCO 2 (ENABL:L) 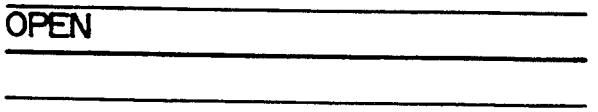

FIG. 8

CHANGEOVER DIRECTION TO RECEIVING MODE →

| | STEP 1 CRYSTAL OUTPUT | STEP 2 PLL IS LOCKED IN CRYSTAL | STEP 3 EXCHANGING DIVIDERS | STEP 4 CHANGEOVER INPUT FROM CRYSTAL TO RECEIVED SIG. |
|---|---|---|---|---|
| | XTAL MODE | | RECEIVING MODE (VCO) | |
| PREF | PLL REF. SIG. GENE. 81 | PLL REF. SIG. GENE. 81 | PLL REF. SIG. GENE. 81 | PLL REF. SIG. GENE. 81 |
| COMP | OSC 87 | VCO 86 | VCO 86 | VCO 86 |
| SW 83 | a | b | c | a |
| SW 88 | b | b | a | a |
| SW 90 | a | a | b | b |
| SW 92 | b | a | b | b |
| VCO | OFF | ON | ON | ON |

PHASE-LOCKED LOOP CIRCUIT

BACKGROUND

1. Field of the Invention

The present invention relates to a Phase-Locked Loop (PLL) circuit in which respectively desired characteristic can be obtained under different conditions such as when the PLL is pulling into synchronization or when it is operating as stabilized.

2. Background of the Invention

An example of the conventional PLL circuit is disclosed in FIG. 10. In this example, phases of a reference input (PREF) and another input (COMP) are compared at a phase comparator 1. The other input (COMP) is derived from a divider 4. A compared output (PHCO) from the comparator is supplied to a phase compensator 2. The output of compensator 2 is then supplied to a voltage controlled oscillator (VCO) 3 so that a clock with a certain frequency can be generated. This clock is divided by a divide 4 and then supplied to the phase comparator 1 as the other input (COMP). A phase-locked loop is made up of phase comparator 1, phase compensator 2, VCO 3 and divider 4. A phase error detector 5 detects a phase error between the reference input (PREF) and the other input (COMP) and supplies the detected result to the phase compensator 2.

The phase comparator 1 is made of a D-type flip-flops 11 and 12, a NAND circuit 13, a FET 14 of PMOS (P-Channel Metal Oxide Semiconductor) and another FET 15 of NMOS (N-Channel Metal Oxide Semiconductor). The phase compensator 2 is made of resistances 17, 18, 19 and 20, an analogue switch 21, a differential amplifier 22 and capacitors 23, 24 and 25. A compared output (PHCO) from the comparator 1 is supplied to an input of the differential amplifier 22 through a resistance 16. A certain supply voltage (Vcc) is divided by the resistances 17 and 18 and then supplied to another input of the differential amplifier 22. The capacitor 23 is connected between the other input and ground. The analogue switch 21 selects a series circuit of a resistance 19 and a capacitor 24, or another series circuit of a resistance 20 and a capacitor 25, so that it can connect one or the other within a feedback loop of the differential amplifier 22.

The D-type flip-flop 12 is triggered by a leading edge of the reference input supplied to a clock terminal of the flip-flop 12. For example, a played back horizontal synchronizing signal is supplied by being separated from a played back video signal out of video disk. Because a D-terminal of the flip-flop 12 is set to logical "H", the flip-flop 12 outputs logical "H" at its Q-terminal once it is triggered. Likewise, the D-type flip-flop 11 is triggered by a leading edge of another input (COMP) derived out of the divider 4 to its clock terminal, and outputs logical "H" at its Q-terminal. The both outputs of flip-flops 11 and 12 are supplied to the NAND circuit 13 which provides an output of logical "L" when the outputs of flip-flops 11 and 12 are both logical "H". The flip-flops 11 and 12 are cleared when the NAND 13 generates the logical "L" output to the clear terminals of flip-flops 11 and 12.

A gate of the P-type FET 14 is connected to a QE terminal of the flip-flop 11. The QE terminal generates a logical output opposite to that at the Q terminal. The FET 14 is therefore turned "ON" when the QE terminal outputs logical "L" and the Q terminal outputs logical "H" from the flip-flop 11. As a result, when the FET 14 is turned "ON" a logical "H" signal is supplied through the resistance 16 to an inverting input terminal of the differential amplifier 22. On the other hand, a gate of the N-type FET 15 is connected to a Q terminal of the flip-flop 12. The FET 15 is therefore turned "ON" when the Q terminal outputs a logical "H" from the flip-flop 12. When the FET 15 is turned "ON", a logical "L" signal is supplied to the inverting input terminal of the differential amplifier 22 (See FIG. 11 for reference).

The differential amplifier 22 compares a voltage received at the inverting input terminal with the reference voltage divided by the resistances 17 and 18, and then generates the output as an error signal. As previously mentioned, the output from the FETs 14 and 15 represents the phase difference between the PREF input and COMP input. The output of differential amplifier 22 represents a differential voltage of the above phase difference signal from the divided reference voltage. The VCO 3 generates a clock signal with a certain frequency which varies corresponding to the differential voltage. The clock is then divided by a certain ratio in the divider 4. The divided output is supplied back to the flip-flop 11 as the COMP input. Thus, the clock synchronized to the PREF input is generated.

The phase error detector 5 detects the extent of phase error between the COMP input and PREF input to the flip-flops 11 and 12, and then controls the analogue switch 21. When the phase error is bigger than a certain reference value, the detector 5 controls the switch 21 so as to select a series circuit of the resistance 19 and the capacitor 24, which has a small time constant. When the phase error is smaller than the reference value, the detector 5 makes the switch 21 select another series circuit of the resistance 20 and the capacitor 25. By this change over operation, gain in the PLL can be controlled as shown in FIG. 12. When the phase error is large, as when the PLL is pulling into synchronization, for example, a characteristic as shown by a line (T2) in FIG. 12 can be obtained. This means the gain in the PLL is set too large. It is therefore, expected that the PLL responses at high speed.

On the other hand, after the PLL is locked and its operation is stabilized, the phase error becomes small and a characteristic as shown by a line (T1) in FIG. 12 is realized. This means the gain in the PLL is set too small. It becomes possible to make jitter small in the clock out of the VCO 3. More stabilized operation can be realized.

In such a conventional PLL circuit, however, the time constant circuits are arranged in the phase compensation circuit 2 and the analogue switch 21 changes over the time constant circuits so as to obtain the desired characteristics. As a result, the circuit arrangement becomes complex, and its cost, therefore, becomes expensive. Furthermore, since the analogue switch 21 is arranged to be changed over at a later stage after the output FETs 14 and 15, it may invite additional noise from the analogue switch 21 since the FETs are in their "OFF" condition with the associated high impedance.

SUMMARY OF THE INVENTION

It is, therefore, an object of the present invention to provide a Phase Locked Loop (PLL) circuit without mixing noise, in which the circuit arrangement is simple and the cost thereof becomes inexpensive.

It is another object of the present invention to provide a PLL circuit which successively varies its output characteristics in accordance with the extent of phase error, so that a desired characteristic can be realized not only when the PLL is pulling in but when it is stabilized.

It is a further object of the present invention to provide a PLL circuit in which a step-like sudden change of clock frequencies is avoided.

It is still another object of the present invention to provide a PLL circuit in which a sudden change can be avoided on a frequency of oscillating clock out of the voltage controlled oscillator.

It is yet another object of the present invention to provide a PLL circuit in which noise generation can be avoided by muting audio output signal when the phase difference becomes bigger than a certain reference value.

In one aspect of the present invention, a phase-locked loop circuit includes a phase comparator for comparing a phase of an input signal with a reference input, connecting circuits having circuit elements arranged in signal paths to be selectively operative, output circuit for supplying an output of the phase comparing means to the connecting circuits, and control circuit located between the output circuit and phase comparator for making a signal path operative by controlling the output circuit.

In another aspect of the invention, a phase-locked loop circuit includes a phase comparator for comparing a phase of an input signal with a reference input, a circuit for providing an output of the phase comparator with a dead time, an output circuit driven with the dead time provided by the circuit for providing, and a connecting circuit having circuit elements arranged in signal paths to be selectively operated by the output circuit.

In accordance with the present invention, a plurality of circuit elements are arranged in signal paths as connecting circuits, one of which can be selectively operated by the result of phase comparison so as to change a gain in the phase-locked loop. The circuit arrangement can be simplified and its cost therefore becomes inexpensive. Since there is no separate analogue switches, noises jumping through switches can be also avoided. In addition, when dead time is provided, the output characteristics of the PLL can be repeatedly controlled in accordance with the extent of phase error. As the result, a desired characteristic can be realized not only when the PLL is pulling in but when it is stabilized.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWING

FIG. 2 shows a timing chart to represent waveforms out of circuit elements in the first embodiment shown in FIG. 1.

FIG. 8 illustrates a table representing conditions of switches arranged in the fourth embodiment shown in FIG. 7.

DESCRIPTION OF THE INVENTION

Figure 1:
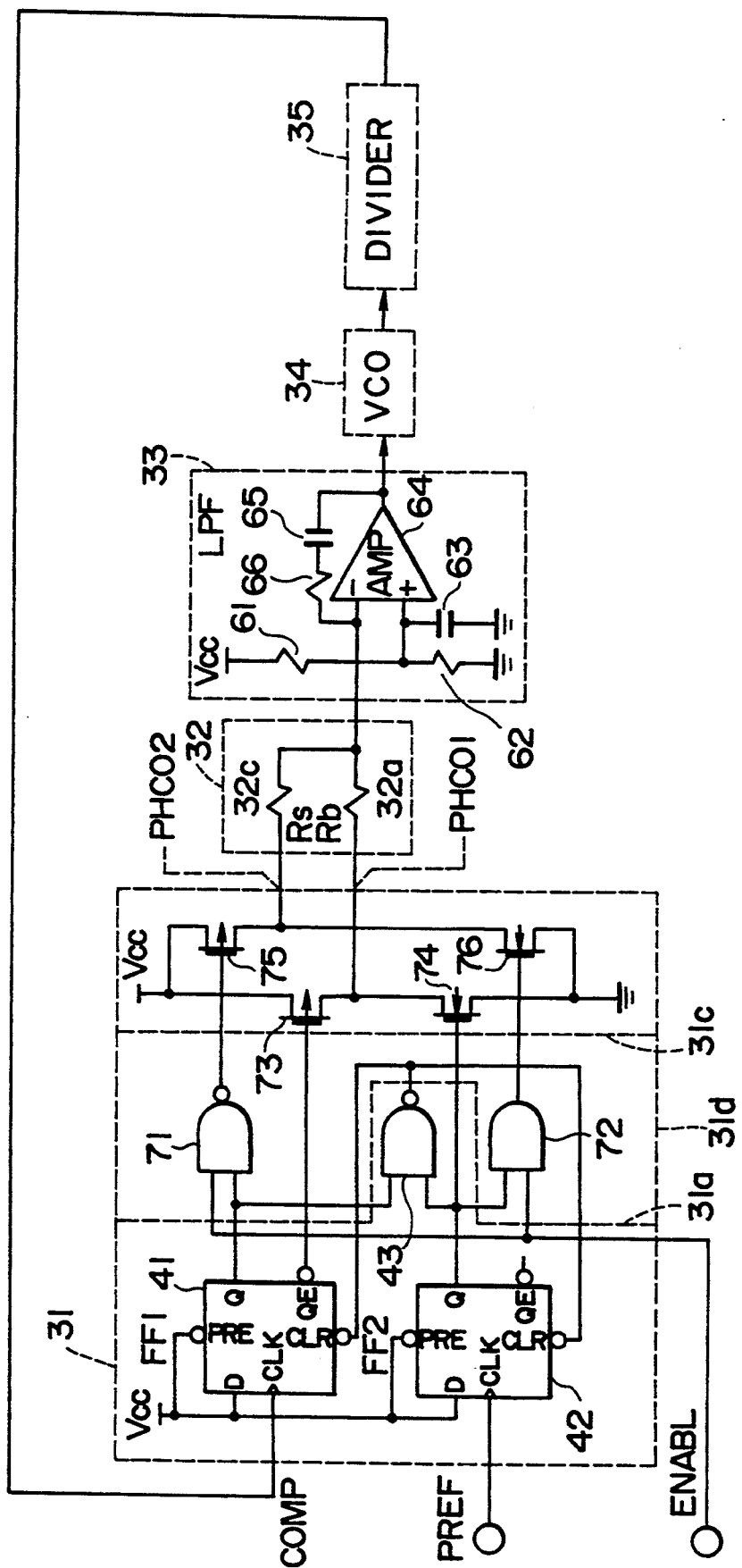
FIG. 1 shows a block diagram of a phase-locked loop circuit as the first embodiment of the present invention.

Referring now to FIG. 1, a phase-locked loop circuit (PLL) as the first embodiment of the invention is made of a phase comparator 31, a phase compensator 33, a voltage controlled oscillator (VCO) 34 and a frequency divider 35. The phase compensator 33 is made of a low pass filter and an amplifier to compensate an output phase of the phase comparator 31. The VCO 34 generates a clock with certain frequencies depending on the output of the phase compensator 33. The divider 35 divides the output of VCO 34 and supplies its output to the phase comparator 31. A connecting circuit 32 is arranged between the phase comparator 31 and phase compensator 33. In this embodiment, the connecting circuit 32 is made of resistances 32a and 32c.

The phase comparator 31 includes a phase comparing portion 31a, a control circuit 31d and an output circuit 31c. The phase comparing portion is made of D-type flip-flops 41 and 42 and a NAND circuit 43. The control circuit 31d is made of a NAND circuit 71 and a AND circuit 72. The output circuit 31c includes a FET 73 of PMOS (P-Channel Metal Oxide Semiconductor) and another FET 74 of NMOS (N-Channel Metal Oxide Semiconductor) serially connected to the FET 73. The output circuit 31c also includes a FET 75 of PMOS and another FET 76 of NMOS serially connected to the FET 75. The FETs 73 and 74 are connected in parallel to the FETs 75 and 76.

The phase compensator 33 includes a pair of resistances 61 and 62 for dividing a certain reference voltage, a differential amplifier 64 for receiving the divided voltage at its non-inverting input, a capacitor 63 also connected to the non-inverting input terminal and a series circuit of a capacitor 65 and a resistance 66, which is arranged in a negative feedback loop.

Referring to FIG. 2, its operation will be explained below. Logical "H" is supplied to both D terminals of the flip-flops 41 and 42. The flip-flop 41 therefore outputs logical "H" at its Q terminal and logical "L" at its QE terminal, which is synchronized with a leading edge of the COMP input as shown in FIG. 2(a), when it is provided by the divider 35. Likewise the flip-flop 42 outputs logical "H" at its Q terminal, which is synchronized with a leading edge of the PREF input as shown in FIG. 2(b), when it is supplied. The flip-flops 41 and 42 both supply their outputs to the NAND circuit 43.

The NAND circuit therefore outputs logical "L" as shown in FIG. 2(e) when the flip-flops 41 and 42 both output logical "H", as shown in FIGS. 2(c) and 2(d), at their Q terminals. An output of the NAND circuit 43 is sent back to the flip-flops 41 and 42 at their CLEAR terminals. The flip-flops 41 and 42 are therefore cleared when the NAND circuit 43 outputs logical "L". As the result, the flip-flops 41 and 42 generate pulse output of logical "H" (shown in FIGS. 2(c) and 2(d)) with a period corresponding to phase error between the COMP input and PREF input.

The QE output of flip-flop 41 is supplied to a gate of the p-type FET 73 and the Q output of flip-flop 42 is supplied to a gate of the n-type FET 74. The p-type FET 73 is turned "ON" when logical "L" is provided, and turned "OFF" when logical. "H" is provided by the flip-flop 41. The n-type FET 74 is turned "ON" when logical "H" is provided, and turned "OFF" when logical "L" is provided by the flip-flop 42. As a result, a compared output PHCO1 is supplied to the resistance 32a which has a relatively larger resistance value. Regardless of whether the enable control input ENABL has logical "H" or logical "L" , this compared input PHC9O1 doesn't change as shown in FIGS. 2(j) and 2(l).

On the other hand, when logical "H" is set to the enable control input ENABL, the NAND circuit 71 generates an output by inverting the Q output of flip-flop 41 as shown in FIG. 2(f). The AND circuit 72 generates the Q output of flip-flop 42 as it is as shown in FIG. 2(g). The p-type FET 75 is turned "ON" when the output of NAND circuit 71 is in logical "L" and turned "OFF" when the output of NAND circuit 71 is in logical "H". The n-type FET 76 is turned "ON" when the output of AND circuit 72 is in logical "H" and turned "OFF" when the output of AND circuit 72 is in logical "L". As a result, a compared output PHCO2 as shown in FIG. 2(k) is supplied to the resistance 32c which is connected to the connecting point between the FETs 75 and 76 and has a relatively smaller resistance value than the resistance 32a.

When logical "L" is set to the enable control input ENABL, the output of NAND circuit 71 always becomes logical "H" as shown in FIG. 2(h). As a result, the FET 75 always turns "OFF". On the other hand, the AND circuit 72 generates a logical "L" output as shown in FIG. 2(i), because logical "L" is supplied to its input. As the result, the FET 76 always becomes logical "L" , too. The compared output shown as PHCO2 in FIG. 2(m) therefore becomes "OPEN" condition.

In other words, when logical "H" is supplied to the enable control input, the resistances 32a and 32c are connected in parallel, so that a smaller time constant is set up. On the other hand, when a logical "L" is supplied to the enable control input, only the resistance 32a is connected. The time constant becomes larger because the resistance value becomes larger. When the PLL is pulling in, it is preferable to a apply logical "H" to the enable control input. By doing so, the time constant becomes small and a gain in the PLL servo becomes big so that a quick response can be expected. After the PLL servo is locked, logical "L" can be applied so as to make the time constant larger. The stabilized servo therefore can be expected.

The phase compensator 33 compensates a phase of the phase error signal generated by the phase comparator 31 under the time constant set by resistance connected at the connecting circuit 32. The VCO 34 generates a clock signal with frequency corresponding to the phase compensated output. The divider 35 divides the clock generated out of the VCO 34, and supplies an output to the phase comparator 31 as its COMP input. Thus, the VCO 34 can generate a clock signal which is synchronized with the PREF input.

Figure 3:
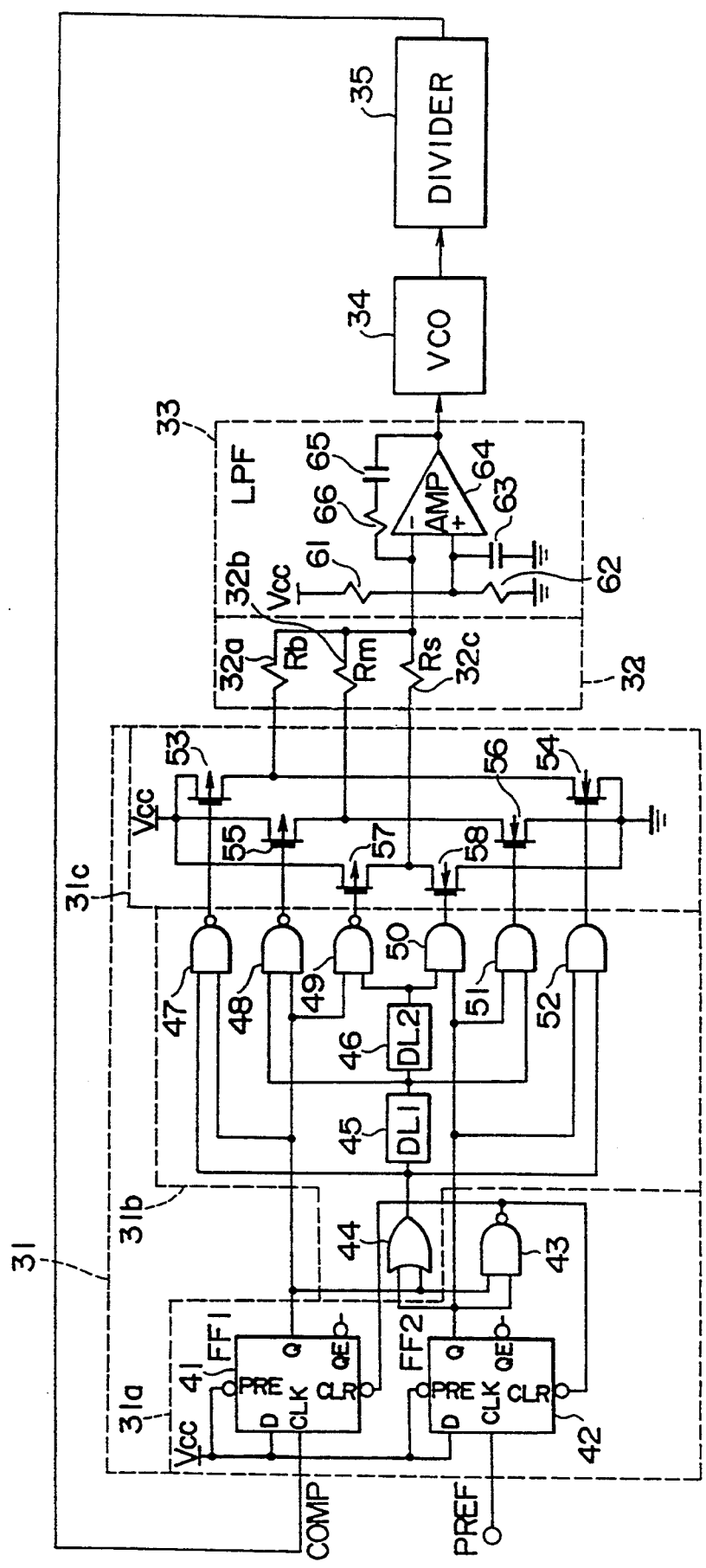
FIG. 3 shows a block diagram of a phase-locked loop circuit as the second embodiment of the present invention.

FIG. 3 shows the second embodiment of the PLL circuit in accordance with the present invention, with the same reference numeral to the common parts or elements as shown in FIG. 1. In this embodiment, the PLL circuit is also made of the phase comparator 31, phase compensator 33, VCO 34 and divider 35. Connecting circuit 32 is arranged between the phase comparator 31 and phase compensator 33. The connecting circuit in this embodiment includes a resistance 32a with a relatively large resistance value, a resistance 32c with a relatively small resistance value and a resistance 32b with a resistance value between that of 32a and 32c. The phase comparator 31 in this embodiment is made of a phase comparing portion 31a, an output circuit 31c and a circuit 31b arranged therebetween for providing dead-time. The organization of the phase comparing portion 31a is identical to the first embodiment shown in FIG. 1. The circuit 31b for providing dead-time is made of an OR circuit 44, a delay circuit 45 to provide a certain delay time (DL1), another delay circuit 46 to provide a further delay time (DL2), NAND circuits 47, 48 and 49, and AND circuits 50, 51 and 52. The output circuit 31c is made of PMOS (P-Channel Metal Oxide Semiconductor) type FETs (Field Effect Transistors) 53, 55 and 57, and NMOS (N-Channel Metal Oxide Semiconductor) type FETs 54, 56 and 58. Three sets of pairs of the FETs 53 and 54, 55 and 56, and 57 and 58 have respectively serial connections. The delay circuits 45 and 46 can be built by a CR circuit, a gate delay circuit or a shift register or other suitable arrangement. The organization of phase compensator 33 is identical to the embodiment shown in FIG. 1.

Referring now to a timing chart shown in FIG. 4, the operation of the second embodiment will be explained below. The flip-flop 41 is triggered by a leading edge of the COMP input (shown in FIG. 4(a)) out of divider 35. The flip-flop 42 is triggered by a leading edge of the PREF input (shown in FIG. 4(b)). These outputs (shown in FIGS. 4(c) and 4(d)) are provided to the NAND circuit 43. The flip-flops 41 and 42 are cleared by the output (shown in FIG. 4(e)) of NAND 43. These operations are exactly same as the first embodiment shown in FIG. 1.

The OR circuit 44 generates the EITHER-OR output from the Q output (shown in FIG. 4(c)) of flip-flop 41 or the Q output (shown in FIG. 4(d)) of flip-flop 42 and supplies it respectively to an input NAND circuit 47 and an AND circuit 52. The Q output of flip-flop 41 is supplied to another input of the NAND circuit 47 and the Q output of flip-flop 42 is supplied to another input of the AND circuit 52. The p-type FET 53 is driven by the output (shown in FIG. 4(i)) of NAND circuit 47 and the n-type FET 54 is driven by the output (shown in FIG. 4(j)) of AND circuit. As the result, the output PHCO31 will be generated in the same way that the output PHCO1 is generated in the first embodiment shown in FIG. 1. At this time, the largest resistance 32a is connected as a time constant circuit. In this extent where the phase error is bigger than −DL1, and less than +DL1, any dead time has not been provided. (See T1 in FIG. 5 for your reference.)

Figure 4:
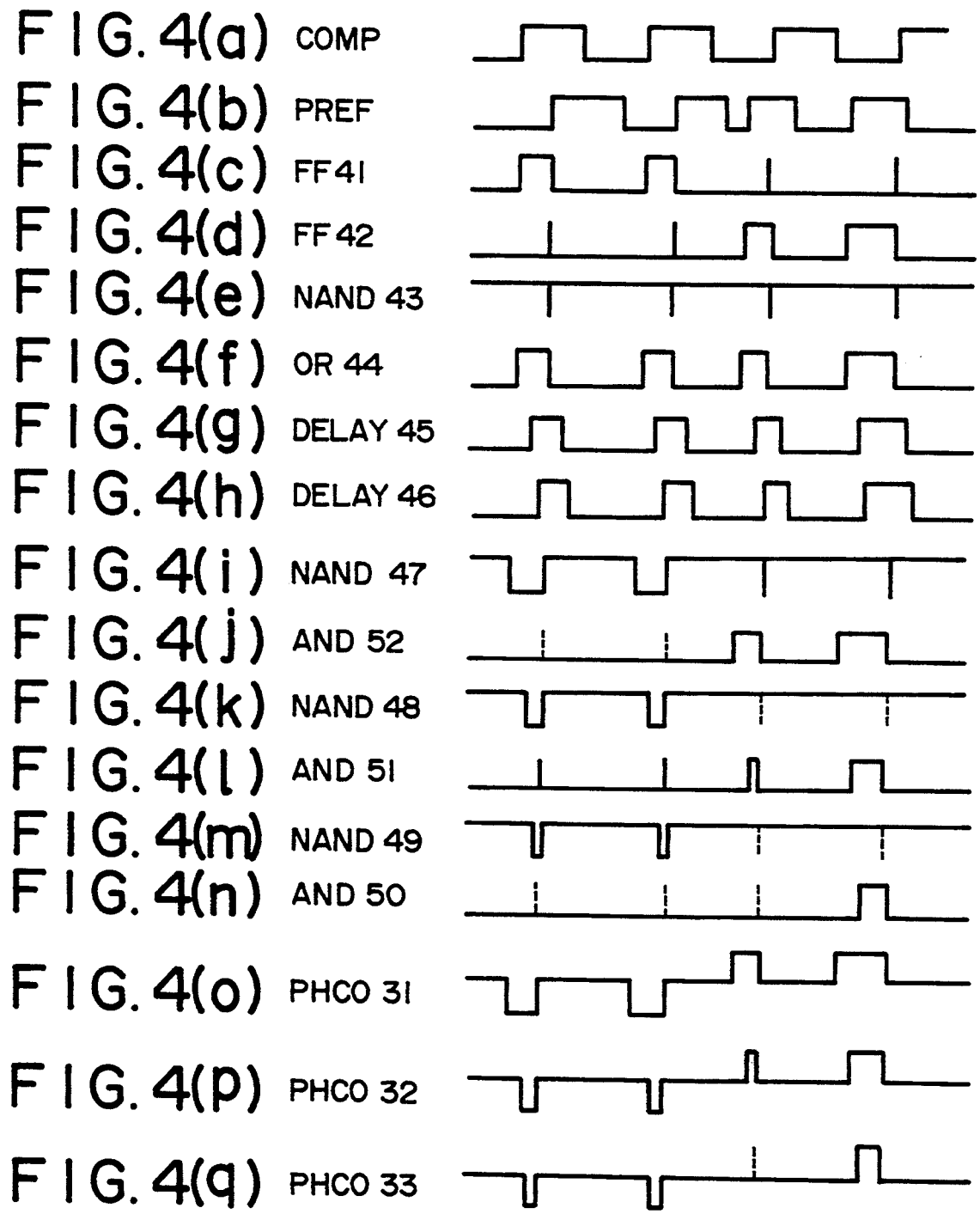
FIG. 4 shows a timing chart to represent waveforms out of circuit elements in the second embodiment shown in FIG. 3.
Figure 5:
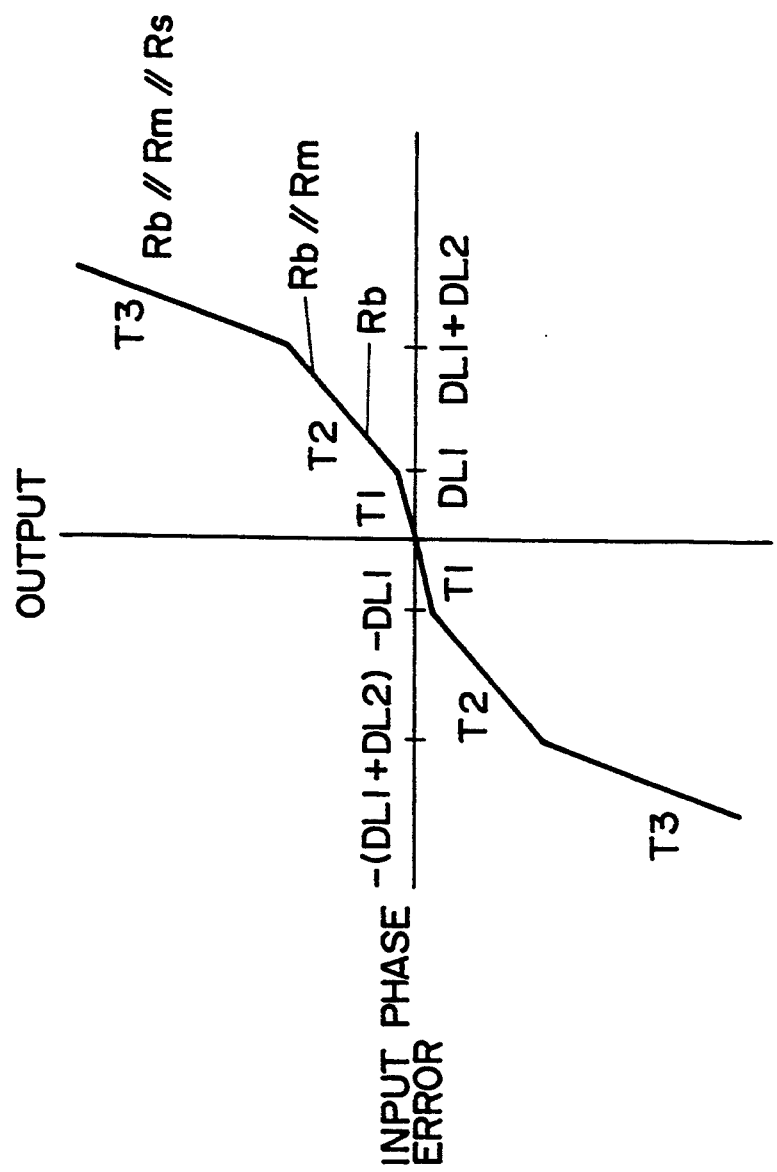
FIG. 5 illustrates output characteristics of the second embodiment shown in FIG. 3.

Referring back to FIGS. 3 and 4, the output (shown in FIG. 4(g)) of OR circuit 44 is delayed by the delay circuit 45 for a certain amount of time (DL1) as shown in FIG. 4(g). The output of delay circuit 45 is supplied respectively to an input of a NAND circuit 48 and an AND circuit 51. The Q output of flip-flop 41 is supplied to another input of the NAND circuit 48 and the Q output of flip-flop 42 is supplied to another input of the AND circuit 51. The output of NAND 48 is provided as an inverted logical multiple of both inputs, therefore, it becomes as shown in FIG. 4(k). On the other hand, the output of AND 51 is provided as a logical multiple of both inputs, therefore, it becomes as shown in FIG. 4(l). The p-type FET 55 is turned "ON" when the output of NAND 48 is in a logical "H", and turned "OFF" when it is in a logical "L". The n-type FET 56 is turned "ON" when the output of AND 51 is in logical "H", and turned "OFF" when it is in a logical "L". As a result, a compared output PHCO32 is supplied to the resistance 32b as shown in FIG. 4(p). At this time, in accordance with the delayed time (DL1) by the delay circuit 45, a dead time zone is set up between $-DL1$ and $+DL1$. In other words, when the phase error is less than $-DL1$ or bigger than $+DL1$, the time constant can be determined by the parallel connection of the resistances 32a and 32b as shown by T2 in FIG. 5.

The output of delay circuit 45 is then supplied to another delay circuit 46 and further delayed with a certain amount of time (DL2). The output of delayed circuit 46 is supplied respectively to an input of a NAND circuit 49 and an AND circuit 50. The Q output of flip-flop 41 is supplied to another input of the NAND circuit 49 and the Q output of flip-flop 42 is supplied to another input of the AND circuit 50. The output of NAND 49 is provided as an inverted logical multiple of both inputs, therefore, it becomes as shown in FIG. 4(m). On the other hand, the output of AND 51 is provided as a logical multiple of both inputs, therefore, it becomes as shown in FIG. 4(n). The p-type FET 57 is turned "ON" when the output of NAND 49 is in a logical "H", and turned "OFF" when it is in a logical "L". The n-type FET 58 is turned "ON" when the output of AND 50 is in logical "H", and turned "OFF" when it is in a logical "L". As a result, a compared output PHCO33 is supplied to the resistance 32c as shown in FIG. 4(q). In other words, when the phase error between the COMP input and PREF input is less than $-(DL1+DL2)$ or bigger than $+(DL1+DL2)$, the time constant can be determined by the parallel connection of the resistances 32a, 32b and 32c as shown by T3 in FIG. 5.

As a result, to the extent that the phase error is bigger than $-DL1$ and smaller than $+DL1$, the largest time constant is set up by the resistance 32a. The middle time constant is set up by the parallel connections of the resistances 32a and 32b when the phase error is in a range between $-(DL1+DL2)$ and $-DL1$ or in another range between $+DL1$ and $+(DL1+DL2)$. Further, when the phase error is smaller than $-(DL1+DL2)$ or bigger than $+(DL1+DL2)$, the smallest time constant is set up by three resistances 32a, 32b and 32c connected in parallel.

In accordance with this second embodiment of the invention, by providing dead time to the output of the phase comparator, different characteristics can be repeatedly obtained with automatically changing the time constant corresponding to the phase error. Of course, the mixture of noise can be also avoided like the first embodiment. The circuit arrangement becomes simple and its cost can be reduced.

Figure 6:
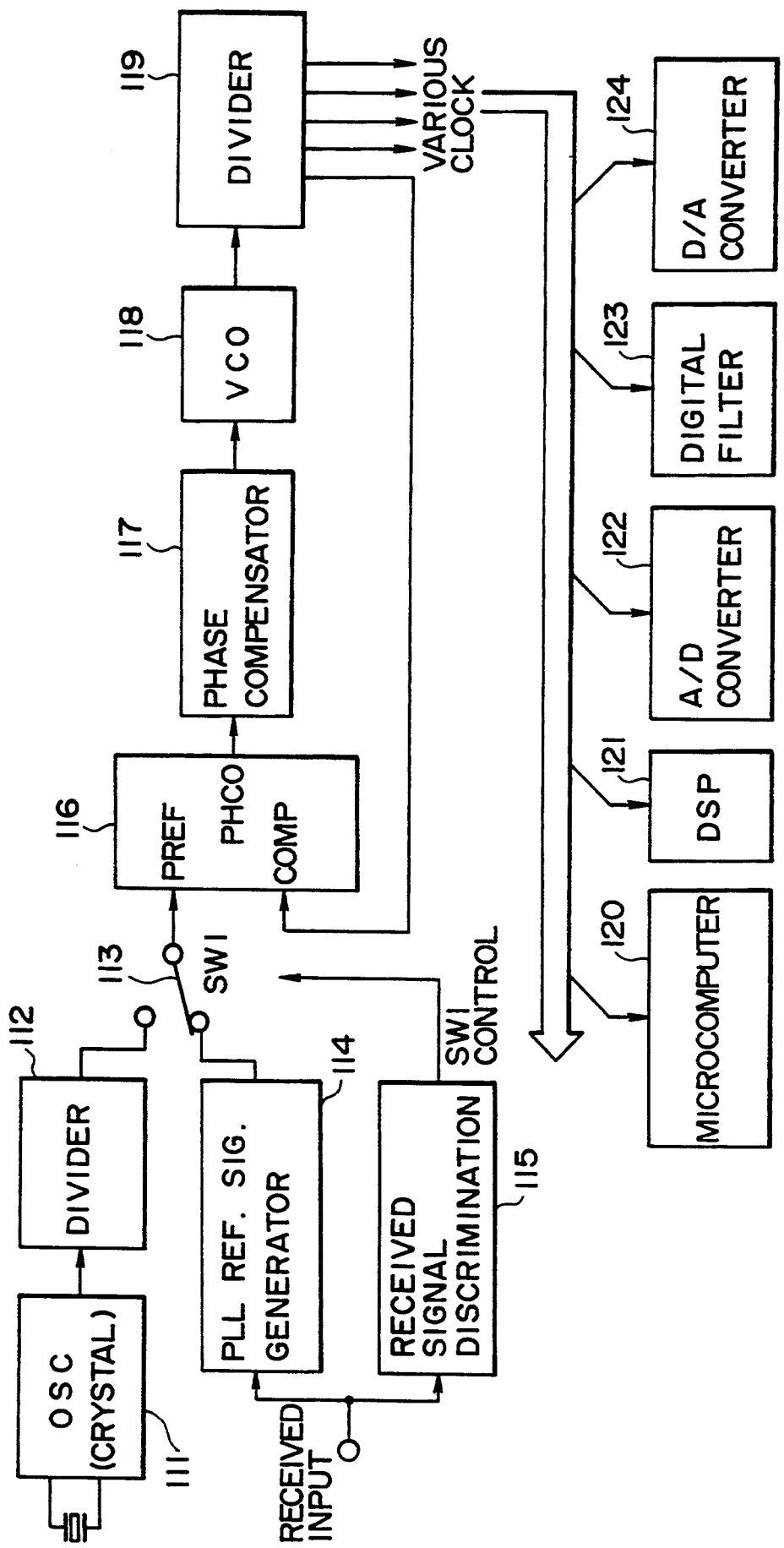
FIG. 6 shows a block diagram of a phase-locked loop circuit as the third embodiment of the present invention.

Referring now to FIG. 6 as the third embodiment of PLL circuit in accordance with the present invention, the PLL includes a phase comparator 116, a phase compensator 117, a voltage controlled oscillator 118 and a divider 119. A reference clock from an oscillator 111 is divided by a divider 112 to generate a divided clock. On the other hand, a generated clock obtained out of a received input through a PLL Reference Signal Generator 114. A switch 113 which is controlled by a Received Signal Discrimination circuit 115 changes over to select the divided clock or the generated clock to be supplied to the phase comparator 116. The divider 119 divides a clock as an output of the VCO 118 and supplies the divided clock to the phase comparator 116 as the COMP input. At the same time, the divider 119 generates various kinds of clock and supplies them to a microcomputer 120, a digital signal processor (DPS) 121, an A/D converter 122, a digital filter 123 and a D/A converter 124, etc.

The operation of the third embodiment in FIG. 6 will be explained below. The Received Signal Discrimination circuit 115 detects whether or not any received signal, such as a digital audio interface signal, exists as an input. When there is no received input, the switch 113 is positioned upwards by the Received Signal Discrimination circuit 115. At this time, the reference clock out of the OSC 111 is divided by the divider 112, and it is thereafter supplied to the phase comparator 116 through the switch 113. As the COMP input of phase comparator 116, the divided clock out of the divider 119 is supplied. By the PLL made of the phase comparator 116, phase compensator 117, VCO 118 and divider 119, the VCO 118 generates a clock which is synchronized with the reference clock out of the OSC 111. As the result, the various clocks including a system clock become synchronized with the reference clock.

When any received signal is derived as an input under the above mentioned condition, the switch 113 is positioned downwards by the Received Signal Discrimination circuit 115. A clock component is separated from the received input by the generator 114. As a result, the generated clock out of the generator 114 is provided to the phase comparator 116 as the reference clock. The PLL, therefore, works as a servomechanism to generate a clock synchronized with the above mentioned generated clock. However, it takes a little time for the PLL to lock in the generated clock. This means that the frequency of clock from VCO 118 gradually changes to synchronize with the generated clock. Sudden change of frequencies on various other clocks including a system clock generated from the divider 119 can be therefore avoided. Since the frequency of the clock gradually changes, the operations of the microcomputer 120 and D/A converter 124 cannot be adversely affected when the switch 113 changes over.

Figure 7:
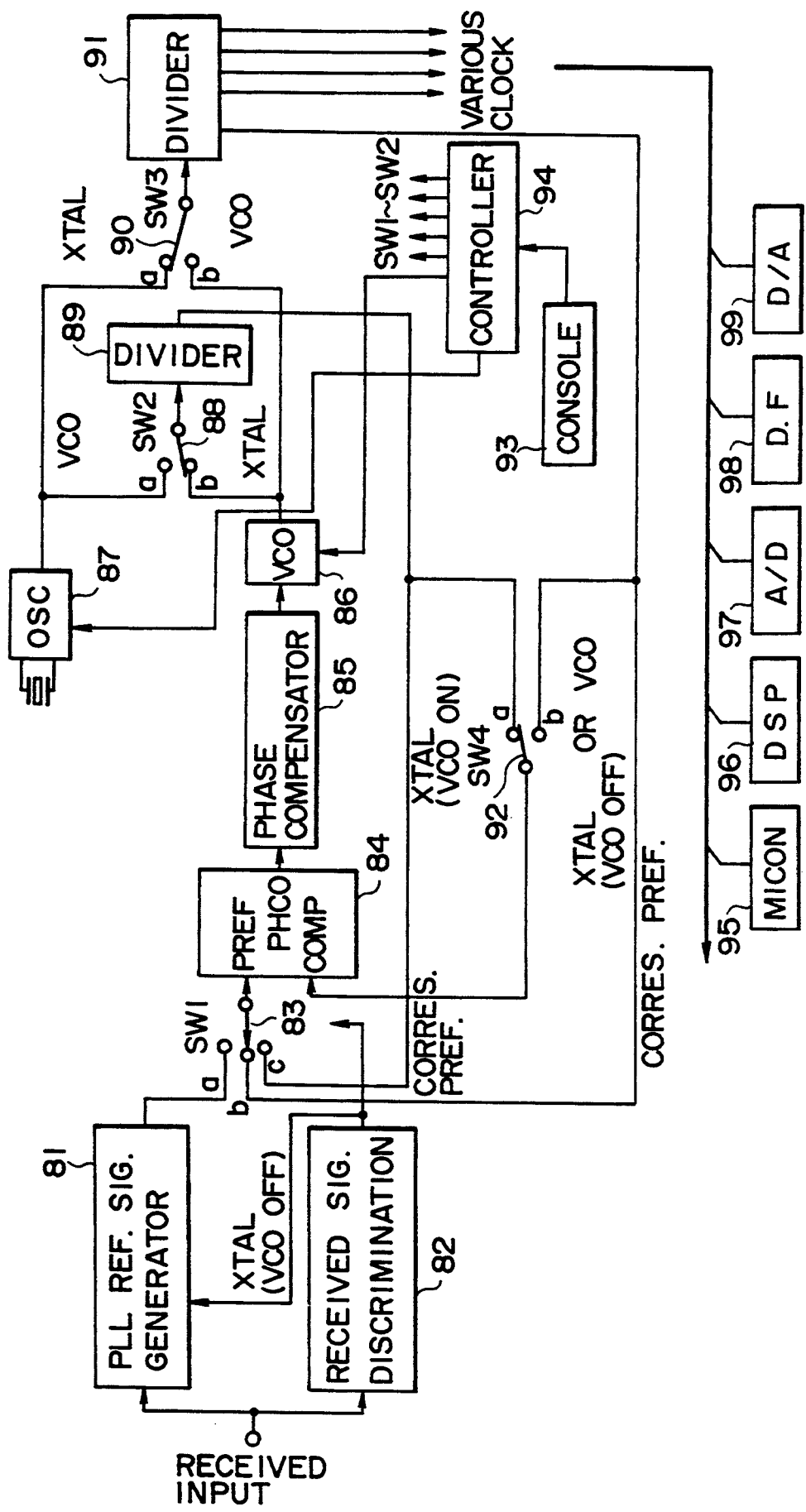
FIG. 7 shows a block diagram of a phase-locked loop circuit as the fourth embodiment of the present invention.

Referring to FIG. 7 which shows the fourth embodiment of the present invention, the PLL is made of a phase comparator 84, a phase compensator 85, a VCO 86 and dividers 89 and 91. An oscillator 87, made of such as a crystal, ceramics or LC, generates a reference clock which is supplied to contacts (a) of switches 88 and 90. The output of VCO 86 is supplied to contacts (b) of switches 88 and 90. The switch 88 selects a signal applied to the contact (a) or (b), and supplies it to the divider 89. Another switch 90 selects a signal applied to the contact (a) or (b), and supplies it to the divider 91.

A PLL Reference Signal Generator 81 retrieves clock component out of the received input such as a digital audio interface signal, and provide it to a contact (a) of the switch 83. A clock (serving as a second clock) divided by the divider 91 is supplied to the contact (b) of switch 83. Another clock (serving as a second reference clock) divided by the divider 89 is supplied to the contact (c) of switch 83. A Received Signal Discrimination circuit 82 detects whether any received input exists and, in response to the detected result, controls the switch 83 to change over. The Received Signal Discrimination circuit 82 also controls an operation of a built-in VCO in the PLL Reference Signal Generator 81. Either one of the clocks from the divider 89 or 91 is selected by a switch 92 and supplied as the COMP input to the phase comparator 84. A controller 94 is provided, in response to operations to a console 93, for changing the conditions of respective switches, controlling the ON-OFF conditions of the OSC 87 and driving and stopping the VCO 86.

The operation of the fourth embodiment in FIG. 7 will be explained below. When a Transmitting Mode (XTAL) is set up in the controller 94 by operating the console 93, the controller 94 turns the VCO "OFF" and turns the OSC 87 "ON". The controller 94 controls the switch 83 to make its contact (a), the switch 88 to make its contact (b), the switch 90 to make its contact (a) and the switch 92 to make its contact (b) as shown at "STEP 1" in FIG. 8. A reference clock from the OSC 87 is supplied to the divider 91 through the switch 90. The divider generates various clocks including a system clock and sends them to the microcomputer 95 through the D/A converter 99.

At the same time, the corresponding PREF signal generated out of the divider 91 is supplied as the COMP input to the phase comparator 84 through the contact (b) of switch 92. The output from PLL Reference Signal Generator 81 is supplied through the contact (a) of switch 83 as the PREF input of the comparator 84. The generator 81 generates a fixed signal of either logical "H" or "L", when no received input appears. Then, the comparator 84 generates an error voltage which acts to reduce the oscillating frequency out of the VCO 86. At this point, the VCO 86 is not yet in operation, but the output of phase comparator 84 is set in a direction to reduce the frequency of the VCO 86. Therefore, the later change over operation can be quickly realized.

The controller 94 turns the VCO 86 "ON" by sending a direction to the controller 94 by hitting the console 93 for changing over to its receiving mode. As shown by "STEP 2" in FIG. 8, the switches 83, 88, 90 and 92 respectively make the contacts (b), (b), (a) and (a) in order. The corresponding PREF clock synchronized with the reference clock out of OSC 87 and generated output of the divider 91 is then supplied as the PREF input to the phase comparator 84 through the switch 83. As the COMP input of comparator 84, the other clock corresponding to PREF is supplied by the divider 89, through the switch 92, which divides the output clock from VCO 86. Thus, the PLL is once locked to the reference clock out of the oscillator 87.

Then, the controller 94 causes the switches 83, 88, 90 and 92 to respectively make their contacts (c), (a), (b) and (b) in order as shown by "STEP 3" in FIG. 8. At this time, similar to the condition immediately before, the signal synchronized with the reference signal from the oscillator 87 is supplied to the PREF input and a clock synchronized with the output from the VCO 86 is supplied to the COMP input of the comparator 84. However, the divider in the PLL is exchanged from the divider 89 to the divider 91. This means that various clocks generated by the divider 91 are now generated so as to synchronize with a clock from the PLL instead of synchronizing with the reference clock directly provided from the OSC 87.

Next, the controller 94 causes the switches 83, 88, 90 and 92 to respectively make their contacts (a), (a), (b) and (b) in order as shown by "STEP 4" in FIG. 8. The clock generated by dividing the output of the VCO 86 at the divider 91 is supplied, as it is, to the COMP input of comparator 84. However, a generated clock from the generator 81 is supplied through the contact (a) of switch 83 as the PREF input. The built-in VCO of generator 81 is turned to its operating condition by a control signal out of the discrimination circuit 82 when a received input exists. This built-in VCO generates a clock synchronized with the clock component included in the received input. Until this time, the PLL is synchronized with the reference clock out of the OSC 87. However, at this stage, the PLL is turned to synchronize with the generated clock from the generator 81. The switch 83 makes a contact (c) not only when the mode is changed but when the received signal has some irregular form, in this embodiment.

To summarize the above operations, the divider 91 which generates various clocks being synchronized with the reference clock from the OSC 87 doesn't suddenly change to use a generated clock from the generator 81 to be synchronized. In this embodiment, the PLL is first synchronized with the reference clock out of the OSC 87. After the PLL is synchronized with the reference clock, the divider 91 is inserted into the PLL. Thereafter, a generated clock out of the generator 81 is supplied instead of the signal synchronized with the reference clock, to the PREF input. The PLL is utilized both when a generated clock is produced and when a clock synchronized with the reference clock. Therefore, a smooth change-over operation can be expected and any sudden change of the frequency can be avoided when various clocks including a system clock out of the divider 91 is changed over.

Figure 9:
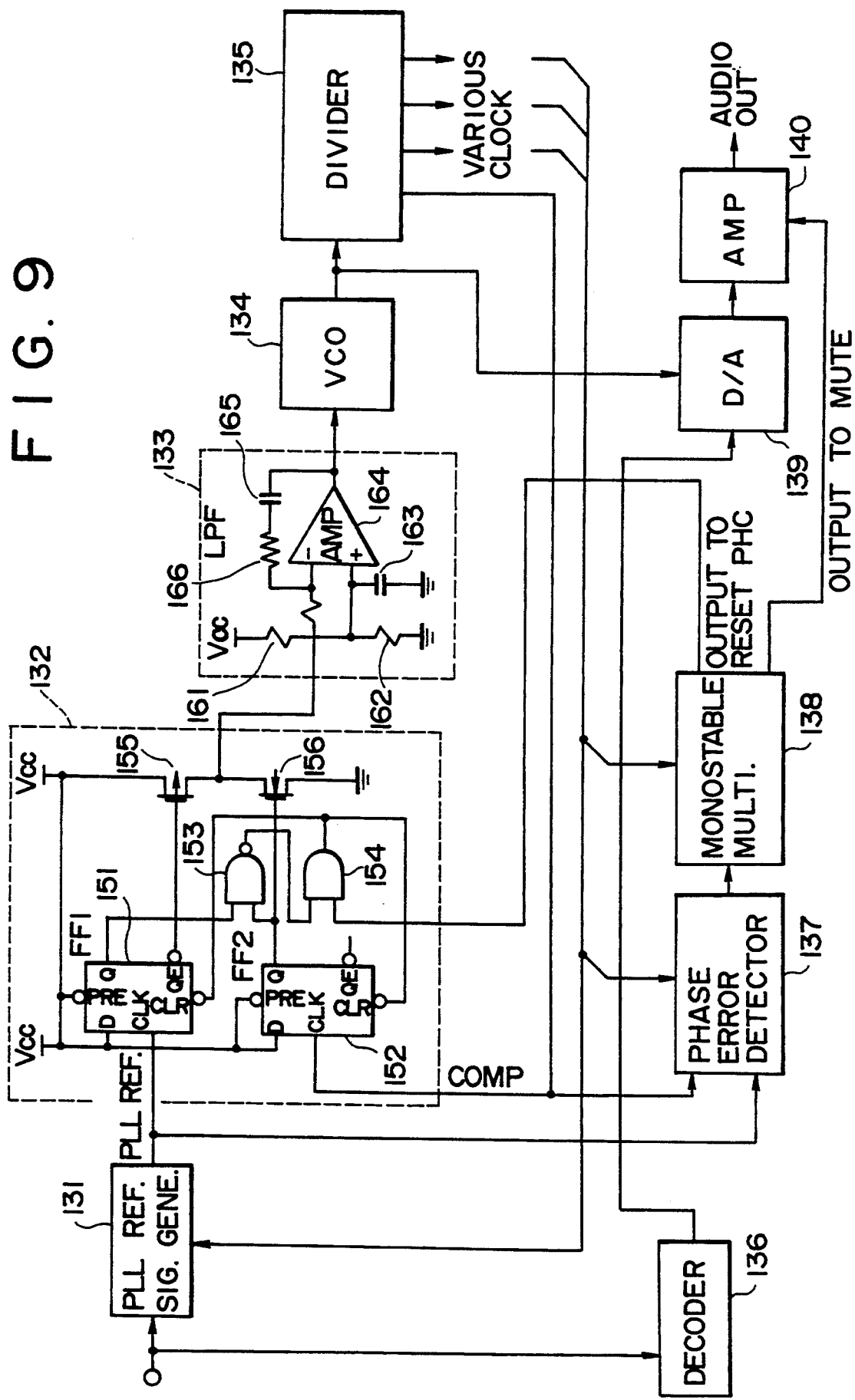
FIG. 9 shows a block diagram of a phase-locked loop circuit as the fifth embodiment of the present invention.
Figure 10:
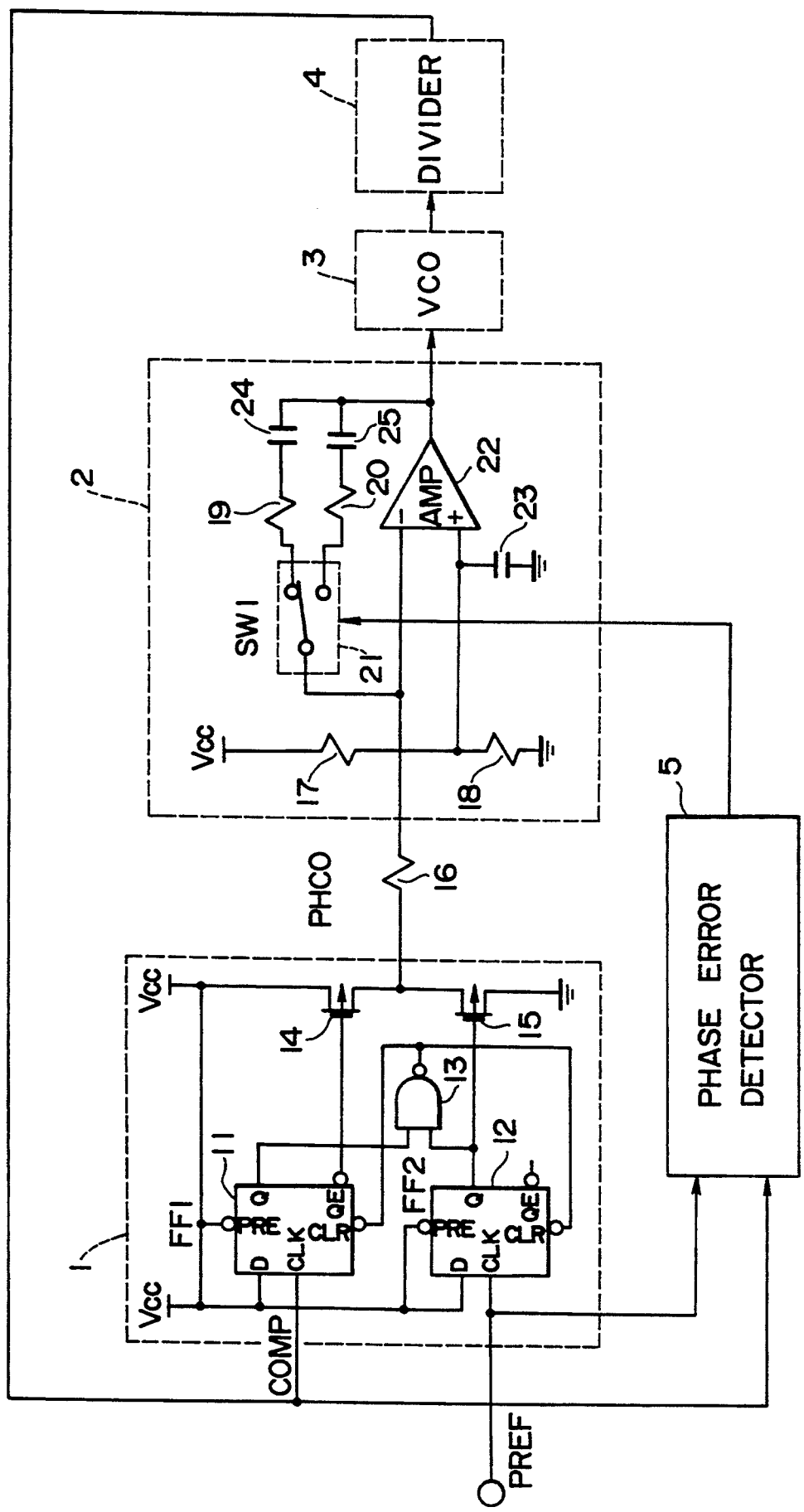
FIG. 10 shows a block diagram of a phase-locked loop circuit as a conventional example.
Figure 11:
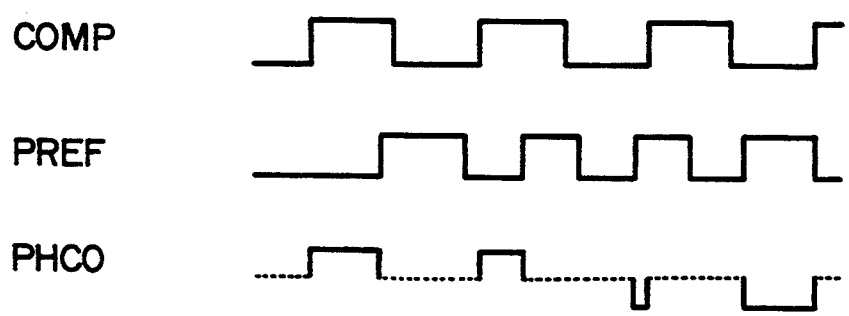
FIG. 11 shows a timing chart to represent waveforms in the conventional example shown in FIG. 10.
Figure 12:
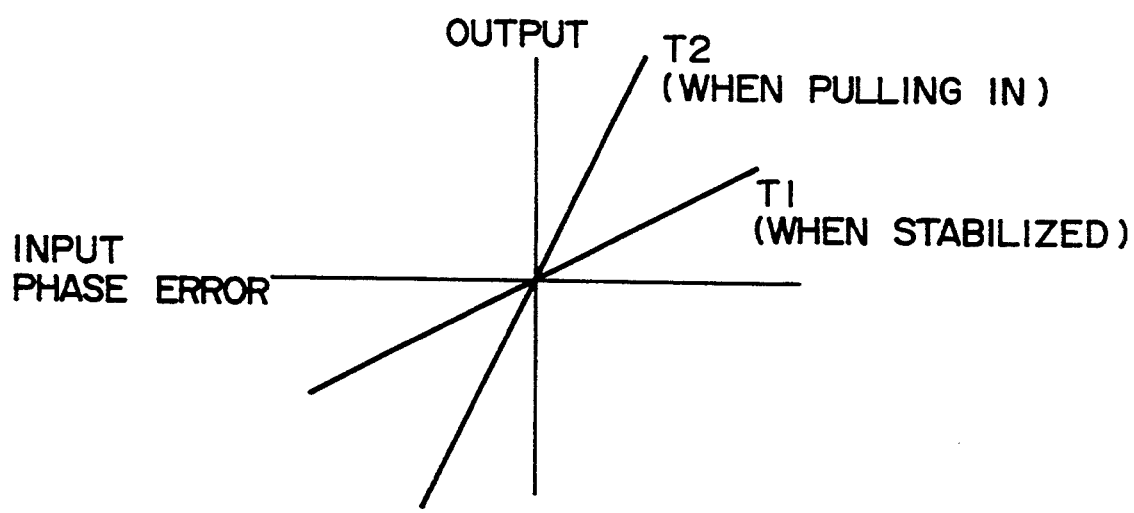
FIG. 12 illustrates output characteristics of the conventional example shown in FIG. 11.

Referring now to FIG. 9 which shows the fifth embodiment of the present invention, a PLL is made of a phase comparator 132, a phase compensator 133, a VCO 134 and a divider 135. A PLL Reference Signal Generator 131 retrieves a clock component from a modulated audio signal derived from outside and supplies it to the PREF input of phase comparator 132. A decoder 136 also receives the audio signal and supplies the decoded signal to a D/A converter 139. The converted audio output from the D/A converter 139 is then supplied to an audio out terminal through an amplifier 140 to be derived to such as a speaker.

The divider 135 generates not only a signal for the COMP input of phase comparator 132 but also various clocks and supplies them to a phase error detector 137 and a monostable multivibrator 138, etc. The phase error detector 137 detects the phase difference between the generated clock out of the generator 131 and the COMP input provided from the divider 135 to the phase comparator 132. Depending on the result of the detection, the detector 137 controls the mono-multivibrator 138. The mono-multivibrator 138 in turn controls the phase comparator 132 and the amplifier 140. The phase comparator 132 is made of D-type flip-flops 151 and 152, a NAND circuit 153, a PMOS type FET 155, a NMOS type FET 156 and an AND circuit 154. The phase compensation circuit 133 includes resistances 161, 162 and 166, capacitors 163 and 165 and a differential amplifier 164. The structure of this phase compensation circuit 133 is basically the same as the embodiments shown in FIGS. 1 and 3.

The operations of this fifth embodiment of the present invention will be explained below. The generator 131 retrieves the clock component out of the incoming audio input and supplies it to a clock terminal of the flip-flop 151 in the phase comparator 132. The clock out of divider 135 is provided as the COMP input to a clock terminal of the flip-flop 152. Both Q output from the flip-flops 151 and 152 are supplied to the NAND circuit 153. The output of NAND 153 is supplied to both CLEAR terminals of the flip-flops 151 and 152.

During its normal condition, the mono-multivibrator 138 sends logical "H" to another input terminal of the AND circuit 154. Therefore, the output from NAND 153 is supplied as it is to the flip-flops 151 and 152. The QE output of flip-flop 151 is supplied to a gate of P-type FET 155 and the Q output of flip-flop 152 is supplied to a gate of N-type FET 156. Similar to the embodiments previously explained, the phase comparator 132 generates an output corresponding to the phase error between the PREF input and the COMP input.

The phase error, after being phase compensated by the compensator 133, is supplied to the VCO 134. The VCO 134 generates a clock with a certain frequency depending on the voltage provided by the compensator 133. This clock is supplied to the divider 135 and divided there. Thereafter, the divided clock is supplied as the COMP input to the clock terminal of flip-flop 152 in the phase comparator 132. Thus, the VCO 134 generates a clock synchronized with the clock component included in the audio signal. The decoder 136 decodes an incoming audio signal and generates an output to the D/A converter 139. Synchronized with clock provided by the VCO 134, the D/A converter 139 converts audio data from the decoder 136 into analogue form and supplies it to the amplifier 140.

The phase error detector 137 detects the phase error between the generated clock out of generator 131 and the COMP input clock out of divider 135, and then compares the detected phase error with a certain reference value. When the phase error is bigger than the certain reference value, the phase error detector 137 controls the mono-multivibrator 138 to generate its logical "L" pulse output at a certain period. The AND circuit 154 in phase comparator 132 converts its output to logical "L" when the logical "L" pulse is supplied from the mono-multivibrator 138. The flip-flops 151 and 152 are then cleared and the FETs 115 and 156 are turned "OFF" and assume their high impedance conditions. As a result, the compensator 134 holds its condition as it was immediately before. This means that the oscillating frequency of the VCO 134 is also held at a certain value. Therefore, even though the phase error suddenly becomes large, it can be avoided that the frequency of various clocks out of the divider 135 suddenly varies to an irregular value.

The amplifier 140 has a muting terminal to be controlled by the mono-multivibrator 138. Depending on the output from the phase error detector 137, the mono-multivibrator controls the muting terminal so as to mute the audio output at a certain duration. By this muting operation, no noise will be generated even when the clock to D/A converter 139 suddenly varies. It is effective in particular when a one-bit D/A converter is utilized as the D/A converter 139.

While specific embodiments of the invention have been shown and disclosed, it is to be understood that numerous changes and modifications may be made by those skilled in the art without departing from the scope and intent of the invention.

What is claimed is:

1. A circuit, comprising:
   connecting means including circuit elements receiving a signal from a first and a second signal path, said first signal path being selectively operative;
   output means for supplying a signal to said connecting means;
   control means for controlling said output means by making said first signal path selectively operative, said control means including means for receiving an enabling signal;
   phase comparing means for comparing a phase of an input signal with a reference input, and for providing an input to said control means and said output means;
   said output means comprising a first transistor pair and a second transistor pair, said first and second transistor pairs generating a phase error signal, said first and second transistor pairs arranged in a push-pull configuration;
   said first transistor pair being connected to said control means, said second transistor pair being connected to said phase comparing means;
   said first signal path comprising said control means and said first transistor pair;
   said second signal path comprising said second transistor pair;
   said first transistor pair includes a PMOS FET, and said control means includes a NAND gate for controlling said PMOS FET; and,
   said first transistor pair includes an NMOS FET, and said control means includes an AND gate for controlling said NMOS FET.

2. A circuit in accordance with claim 1, wherein said first signal path is operative when said enabling signal is set to a logical High and said first signal path is in an open circuit condition when said enabling signal is set to a logical Low.

3. A circuit in accordance with claim 1, further comprising:
   phase compensating means for compensating a phase of said phase error signal, said phase compensating means having a time constant set by said connecting means, said phase compensating means producing a phase compensated output signal;
   signal producing means for producing said reference signal, having a variable frequency; and,
   said signal producing means includes a voltage controlled oscillator, having said phase compensated output signal as an input.

4. A circuit in accordance with claim 1, comprising:
   first means for generating a reference clock;
   second means for generating a synchronized clock, said synchronized clock synchronized with an input signal;
   selecting means for selecting a selected clock from said reference clock or said synchronized clock; and,
   said input signal to the phase comparing means being said selected clock.

5. A circuit, comprising:

phase comparing means for comparing a phase of an input signal with a reference input:

connecting means including circuit elements receiving a signal from a first and a second signal path, said first signal path being selectively operative:

output means, driven with a dead time, for supplying a signal to said connecting means;

said output means comprising a first transistor pair and a second transistor pair, said first and second transistor pairs generating a phase error signal, said first and second transistor pairs arranged in a push-pull configuration;

control means for controlling said output means;

first logic means for producing an OR output of said phase comparing means;

a delay means for producing a delayed output of said OR output, said delay means having a delay time;

second logic means for comparing said delayed output with said OR output, said second logic means connected to said first transistor pair;

said control means comprising said first logic means connected to said delay means connected to said second logic means;

said first transistor pair being connected to said control means;

said second transistor pair having a first input a logical inverse of said input signal, and a second input a logical equal of said reference signal;

said first signal path comprising said phase comparing means, said first logic means, said delay means, said second logic means, and said first transistor pair; and, said second signal path comprising said phase comparing means, second transistor pair;

said first signal path being operative when said phase error signal is smaller than said delay time.

6. A circuit in accordance with claim 5, wherein:

said control means further comprises a third logic means, having the OR output as an input and said second transistor pair as an output, said third logic means for inverting said input signal and passing through said reference signal; and, said second signal path further comprises said first logic means and said third logic means.

7. A circuit in accordance with claim 5, wherein:

said first transistor pair includes a PMOS FET, and said second logic means includes a NAND gate for controlling said PMOS FET; and, said first transistor pair includes an NMOS FET, and said control means includes an AND gate for controlling said NMOS FET.

8. A circuit in accordance with claim 5, further comprising:

phase compensating means for compensating a phase of said phase error signal having a time constant set by said connecting means, said phase compensating means producing a phase compensated output signal;

signal producing means for producing said reference signal, having a variable frequency; and said signal producing means includes a voltage controlled oscillator, having said phase compensated output signal as an input.

9. A circuit in accordance with claim 5, wherein:

said connecting means comprises a first resistor connected to said first signal path and a second resistor connected to said second signal path;

said connecting means having a total resistance equal to said first resistor and said second resistor connected in parallel when said first signal means is operational, and a total resistance equal to said second resistor when said first signal means is not operational; and, said phase error signal having a time constant set by said connecting means, said time constant proportional to said total resistance.

10. A circuit in accordance with claim 5 comprising:

first means for generating a reference clock;

second means for generating a synchronized clock, said synchronized clock synchronized with an input signal;

selecting means for selecting a selected clock from said reference clock or said synchronized clock; and, said input signal to the phase comparing means being said selected clock.

11. A circuit comprising:

connecting means including circuit elements receiving a signal from a first and a second signal path, said first signal path being selectively operative;

output means for supplying a signal to said connecting means;

control means for controlling said output means by making said first signal path selectively operative, said control means including means for receiving an enabling signal;

phase comparing means for comparing a phase of an input signal with a reference input, and for providing an input to said control means and said output means;

said output means comprising a first transistor pair and a second transistor pair, said first and second transistor pairs generating a phase error signal, said first and second transistor pairs arranged in a push-pull configuration;

said first transistor pair being connected to said control means, said second transistor pair being connected to said phase comparing means;

said first signal path comprising said control means and said first transistor pair;

said second signal path comprising said second transistor pair;

said connecting means comprises a first resistor connected to said first signal path and a second resistor connected to said second signal path;

said connecting means having a total resistance equal to said first resistor and said second resistor connected in parallel when said first signal path is operational, and a total resistance equal to said second resistor when said first signal path is not operational; and, said phase error signal having a time constant set by said connecting means, said time constant proportional to said total resistance.

12. A circuit in accordance with claim 11, wherein said first signal path is operative when said enabling signal is set to a logical High and said first signal path is in an open circuit condition when said enabling signal is set to a logical Low.

13. A circuit in accordance with claim 11, further comprising:

phase compensating means for compensating a phase of said phase error signal, said phase compensating means having a time constant set by said connecting means, said phase compensating means producing a phase compensated output signal;

signal producing means for producing said reference signal, having a variable frequency; and, said signal producing means includes a voltage controlled oscillator, having said phase compensated output signal as an input.

14. A circuit in accordance with claim 11, comprising:

first means for generating a reference clock;

second means for generating a synchronized clock, said synchronized clock synchronized with an input signal;

selecting means for selecting a selected clock from said reference clock or said synchronized clock; and, said input signal to the phase comparing means being said selected clock.

15. A phase locked loop circuit, comprising:

connecting means including circuit elements receiving a signal from a first and a second signal path, said first signal path being selectively operative;

said connecting means comprises a first resistor connected to said first signal path and a second resistor connected to said second signal path;

said connecting means having a total resistance equal to said first resistor and said second resistor connected in parallel when said first signal means is operational, and a total resistance equal to said second resistor when said first signal means is not operational; and, output means for supplying a signal to said connecting means;

control means for controlling said output means by making said first signal path selectively operative, said control means including means for receiving an enabling signal;

said first signal path being operative when said enabling signal is set to a logical High and said first signal path is in an open circuit condition when said enabling means is set to a logical Low;

phase comparing means for comparing a phase of an input signal with a reference input, and for providing an input to said control means and said output means;

said output means comprising a first transistor pair, and a second transistor pair, said first and second transistor pairs generating a phase error signal, said first and second transistor pairs arranged in a push-pull configuration;

said first transistor pair being connected to said control means, said second transistor pair being connected to said phase comparing means;

said first transistor pair includes an NMOS FET and a PMOS FET;

said control means includes an AND gate for controlling said NMOS FET and a NAND gate for controlling said PMOS FET;

said phase error signal having a time constant set by said connecting means, said time constant proportional to said total resistance;

said first signal path comprising said control means and said first transistor pair; and, said second signal path comprising said second transistor pair;

phase compensating means for compensating a phase of said phase error signal, said phase compensating means producing a phase compensated output signal;

signal producing means for producing said reference signal, having a variable frequency; and, said signal producing means includes a voltage controlled oscillator, having said phase compensated output signal as an input.

16. A phase locked loop circuit, comprising:

phase comparing means for comparing a phase of an input signal with a reference input;

connecting means including circuit elements receiving a signal from a first and a second signal path, said first signal path being selectively operative;

said connecting means comprises a first resistor connected to said first signal path and a second resistor connected to said second signal path;

said connecting means having a total resistance equal to said first resistor and said second resistor connected in parallel when said first signal means is operational, and a total resistance equal to said second resistor when said first signal means is not operational; and, output means, driven with a dead time, for supplying a signal to said connecting means;

said output means comprising a first transistor pair, and a second transistor pair, said first and second transistor pairs generating a phase error signal, said first and second transistor pairs arranged in a push-pull configuration;

control means for controlling said output means;

first logic means for producing an OR output of said phase comparing means;

a delay means for producing a delayed output of said OR output, said delay means having a delay time;

second logic means for comparing said delayed output with said OR output, said second logic means connected to said first transistor pair;

said control means comprising said first logic means connected to said delay means connected to said second logic means;

said first transistor pair being connected to said control means;

said second transistor pair having a first input a logical inverse of said input signal, and a second input a logical equal of said reference signal;

said first transistor pair includes an NMOS FET and a PMOS FET;

said second logic includes an AND gate for controlling said NMOS FET and a NAND gate for controlling said PMOS FET;

said phase error signal having a time constant set by said connecting means, said time constant proportional to said total resistance;

said first signal path comprising said phase comparing means, said first logic means, said delay means, said second logic means, and said first transistor pair; and, said second signal path comprising said phase comparing means, second transistor pair;

phase compensating means for compensating a phase of said phase error signal, said phase compensating means producing a phase compensated output signal;

signal producing means for producing said reference signal, having a variable frequency;

said signal producing means includes a voltage controlled oscillator, having said phase compensated output signal as an input; and, said first signal path being operative when said phase error signal is smaller than said delay time.

17. A circuit in accordance with claim 16, wherein:
said control means further comprises a third logic means, having the OR output as an input and said second transistor pair as an output, said third logic means for inverting said input signal and passing through said reference signal; and,
said second signal path further comprises said first logic means and said third logic means.

18. A phase locked loop circuit, comprising:
connecting means including circuit elements receiving a signal from a first and a second signal path, said first signal path being selectively operative;
said connecting means comprises a first resistor connected to said first signal path and a second resistor connected to said second signal path;
said connecting means having a total resistance equal to said first resistor and said second resistor connected in parallel when said first signal means is operational, and a toted resistance equal to said second resistor when said first signal means is not operational; and,
output means for supplying a signal to said connecting means;
control means for controlling said output means by making said first signal path selectively operative, said control means including means for receiving an enabling signal;
said first signal path being operative when said enabling signal is set to a logical High and said first signal path is in an open circuit condition when said enabling means is set to a logical Low;
phase comparing means for comparing a phase of an input signal with a reference input, and for providing an input to said control means and said output means;
said output means comprising a first transistor pair, and a second transistor pair, said first and second transistor pairs generating a phase error signal, said first and second transistor pairs arranged in a push-pull configuration;
said first transistor pair being connected to said control means, said second transistor pair being connected to said phase comparing means;
said first transistor pair includes an NMOS FET and a PMOS FET;
said control means includes an AND gate for controlling said NMOS FET and a NAND gate for controlling said PMOS FET;
said phase error signal having a time constant set by said connecting means, said time constant proportional to said total resistance;
said first signal path comprising said control means and said first transistor pair; and,
said second signal path comprising said second transistor pair;
phase compensating means for compensating a phase of said phase error signal, said phase compensating means producing a phase compensated output signal;
signal producing means for producing said reference signal, having a variable frequency;
said signal producing means includes a voltage controlled oscillator, having said phase compensated output signal as an input;
first means for generating a reference clock;
second means for generating a synchronized clock, said synchronized clock synchronized with an input signal;
selecting means for selecting a selected clock from said reference clock or said synchronized clock; and,
said input signal to the phase comparing means being said selected clock.

19. A phase locked loop circuit, comprising:
phase comparing means for comparing a phase of an input signal with a reference input;
connecting means including circuit elements receiving a signal from a first and a second signal path, said first signal path being selectively operative;
said connecting means comprises a first resistor connected to said first signal path and a second resistor connected to said second signal path;
said connecting means having a total resistance equal to said first resistor and said second resistor connected in parallel when said first signal means is operational, and a total resistance equal to said second resistor when said first signal means is not operational; and,
output means, driven with a dead time, for supplying a signal to said connecting means;
said output means comprising a first transistor pair, and a second transistor pair, said first and second transistor pairs generating a phase error signal, said first and second transistor pairs arranged in a push-pull configuration;
control means for controlling said output means;
first logic means for producing an OR output of said phase comparing means;
a delay means for producing a delayed output of said OR output, said delay means having delay time;
second logic means for comparing said delayed output with said OR output, said second logic means connected to said first transistor pair;
said control means comprising said first logic means connected to said delay means connected to said second logic means;
said first transistor pair being connected to said second logic means;
said second transistor pair having a first input a logical inverse of said input signal, and a second input a logical equal of said reference signal;
said first transistor pair includes an NMOS FET and a PMOS FET;
said control means includes an AND gate for controlling said NMOS FET and a NAND gate for controlling said PMOS FET;
said phase error signal having a time constant set by said connecting means, said time constant proportional to said total resistance;
said first signal path comprising said phase comparing means, said first logic means, said delay means, said second logic means, and said first transistor pair; and,
said second signal path comprising said phase comparing means, second transistor pair;
phase compensating means for compensating a phase of said phase error signal, said phase compensating means producing a phase compensated output signal;
signal producing means for producing said reference signal, having a variable frequency;

said signal producing means includes a voltage controlled oscillator, having said phase compensated output signal as an input;

said first signal path being operative when said phase error signal is smaller than said delay time;

first means for generating a reference clock;

second means for generating a synchronized clock, said synchronized clock synchronized with an input signal;

selecting means for selecting a selected clock from said reference clock or said synchronized clock; and, said input signal to the phase comparing means being said selected clock.

20. A circuit in accordance with claim 19, wherein:

said control means further comprises a third logic means, having the OR output as an input and said second transistor pair as an output, said third logic means for inverting said input signal and passing through said reference signal; and, said second signal path further comprises said first logic means and said third logic means.

* * * * *